United States Patent
Bertsche

(10) Patent No.: US 6,822,246 B2
(45) Date of Patent: Nov. 23, 2004

(54) RIBBON ELECTRON BEAM FOR INSPECTION SYSTEM

(75) Inventor: Kirk J. Bertsche, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 106 days.

(21) Appl. No.: 10/109,168

(22) Filed: Mar. 27, 2002

(65) Prior Publication Data

US 2003/0183763 A1 Oct. 2, 2003

(51) Int. Cl.$^7$ .............................. H01J 37/08; G21G 5/00
(52) U.S. Cl. ........................ 250/492.21; 250/492.3; 250/396 R; 250/310; 250/311
(58) Field of Search ................... 250/310, 311, 250/307, 396 R, 396 ML, 492.21, 492.3

(56) References Cited

U.S. PATENT DOCUMENTS

| | | | | |
|---|---|---|---|---|
| 3,128,405 A | * | 4/1964 | Lambertson | 313/62 |
| 3,831,121 A | * | 8/1974 | Oster | 335/210 |
| 4,012,657 A | * | 3/1977 | Loty | 313/537 |
| 4,140,913 A | * | 2/1979 | Anger et al. | 250/492.2 |
| 4,276,477 A | * | 6/1981 | Enge | 250/398 |
| 4,303,864 A | | 12/1981 | Crewe et al. | |
| 4,389,571 A | | 6/1983 | Crewe | |
| 4,414,474 A | | 11/1983 | Crewe | |
| 4,469,950 A | * | 9/1984 | Taylor et al. | 250/492.2 |
| 4,492,873 A | * | 1/1985 | Dmitriev et al. | 250/492.3 |
| 4,554,457 A | * | 11/1985 | Kelly | 250/396 ML |
| 4,571,726 A | * | 2/1986 | Wortman et al. | 372/2 |
| 4,629,899 A | * | 12/1986 | Plies | 250/396 ML |
| 4,853,545 A | * | 8/1989 | Rose | 250/396 R |
| 4,954,705 A | * | 9/1990 | Brunner et al. | 250/310 |
| 5,013,923 A | | 5/1991 | Litherland et al. | |
| 5,254,417 A | * | 10/1993 | Wada | 430/5 |
| 5,350,926 A | | 9/1994 | White et al. | |
| 5,557,178 A | * | 9/1996 | Talman | 315/501 |

(List continued on next page.)

OTHER PUBLICATIONS

D. Slimani, Numerical design of an electron ribbon beam gun of pierce type in three dimensions; total pages: 6; Electronics Dept., University of Ferhat Abbas, Algeria.

(List continued on next page.)

*Primary Examiner*—John R. Lee
*Assistant Examiner*—Kalimah Fernandez
(74) *Attorney, Agent, or Firm*—Okamoto & Benedicto LLP

(57) ABSTRACT

Apparatus configurations are disclosed for generating a ribbon-like beam that impinges onto a target specimen as an elongated spot. The elongated spot has a first dimension that is substantially elongated in comparison to a second dimension. The configuration may be non-axisymmetric and include means for point-to-parallel focusing in the first dimension and point-to-point focusing in the second dimension. In accordance with one embodiment, the apparatus may include a first lens subsystem for transforming the electron beam into an intermediate-stage beam, and a second lens subsystem for focusing the intermediate-stage beam into the elongated spot. Methods are disclosed for focusing the electron beam into the elongated spot. In accordance with one embodiment, a method may include transforming the electron beam into an intermediate-stage beam, and focusing the intermediate-stage beam into a ribbon-like beam that impinges onto a target specimen as an elongated spot.

18 Claims, 12 Drawing Sheets

U.S. PATENT DOCUMENTS

| | | | |
|---|---|---|---|
| 5,578,821 A | | 11/1996 | Meisberger et al. |
| 5,668,372 A | * | 9/1997 | Iwabuchi et al. ........... 250/310 |
| 5,834,786 A | | 11/1998 | White et al. |
| 5,866,905 A | * | 2/1999 | Kakibayashi et al. ....... 250/311 |
| 5,869,833 A | | 2/1999 | Richardson et al. |
| 5,892,224 A | * | 4/1999 | Nakasuji ..................... 250/310 |
| 5,973,323 A | | 10/1999 | Adler et al. |
| 6,011,262 A | * | 1/2000 | Hamashima et al. ........ 250/310 |
| 6,025,600 A | * | 2/2000 | Archie et al. ........... 250/396 R |
| 6,039,000 A | * | 3/2000 | Libby et al. ............. 118/723 E |
| 6,051,834 A | * | 4/2000 | Kakibayashi et al. ....... 250/311 |
| 6,066,849 A | * | 5/2000 | Masnaghetti et al. ....... 250/310 |
| 6,252,705 B1 | * | 6/2001 | Lo et al. ..................... 359/393 |
| 6,259,094 B1 | * | 7/2001 | Nagai et al. ................ 250/310 |
| 6,274,290 B1 | * | 8/2001 | Veneklasen et al. ........ 430/296 |
| 6,497,194 B1 | * | 12/2002 | Libby et al. ............ 118/723 FI |
| 6,522,056 B1 | * | 2/2003 | Mauck ................... 313/359.1 |
| 6,531,697 B1 | * | 3/2003 | Nakamura et al. .......... 250/311 |
| 6,559,446 B1 | * | 5/2003 | Choo et al. ................. 250/310 |

OTHER PUBLICATIONS

R. Brinkmann, et al., A low emittance, flat–beam electron source for linear colliders; pp. 453–455; Proceedings of EPAC 2000; Vienna, Austria.

Karl L. Brown, et al., First and second–order charged particle optics; pp. 1–78, SLAC–PUB–3381 Jul. 1984; Presented at Brookhaven National Laboratory, Upton, NY, Jul. 6–16, 1983.

K.L. Brown, A second–order magnetic optical achromat; pp. 1–28 and figs. 1,2, & 3, SLAC–PUB–2257 Feb. 1979; Stanford University, California, USA.

* cited by examiner

System cross-section in x-plane

System cross-section in y-plane

RIBBON ELECTRON BEAM FOR INSPECTION SYSTEM

BACKGROUND OF THE INVENTION

1. Field of the Invention

The present invention relates generally to scanning electron microscopy. More particularly, it relates to scanning electron microscopy used for specimen inspection.

2. Description of the Background Art

An example of a scanning electron microscope (SEM) system is shown in FIG. 1A for purposes of background explanation. The particular system of FIG. 1A is described in U.S. Pat. No. 5,578,821, entitled "Electron Beam Inspection System and Method," issued to Meisberger et al. and assigned to KLA-Tencor Corporation of San Jose, Calif. The disclosure of U.S. Pat. No. 5,578,821 (the Meisberger patent) is hereby incorporated by reference.

FIG. 1A (corresponding to FIG. 5 in the Meisberger patent) is a simplified schematic representation of the paths of the primary, secondary, back-scatter and transmitted electrons through the electron optical column and collection system for electron beam inspection. In brief, FIG. 1A shows a schematic diagram of the various electron beam paths within the column and below substrate 57. Electrons are emitted radially from field emission cathode 81 and appear to originate from a very small bright point source. Under the combined action of the accelerating field and condenser lens magnetic field, the beam is collimated into a parallel beam. Gun anode aperture 87 masks off electrons emitted at unusable angles, while the remaining beam continues on to beam limiting aperture 99. An upper deflector (not depicted) is used for stigmation and alignment, ensuring that the final beam is round and that it passes through the center of the objective lens 104 comprising elements 105, 106 and 107. A condenser lens (not depicted) is mechanically centered to the axis defined by cathode 81 and beam limiting aperture 99. The deflection follows the path shown, so that the scanned, focused probe (beam at point of impact with the substrate) emerges from the objective lens 104.

In High Voltage mode operation, Wien filter deflectors 112 and 113 deflect the secondary electron beam 167 into detector 117. When partially transparent masks are imaged, the transmitted beam 108 passes through electrode system 123 and 124 that spreads the beam 108 before it hits the detector 129. In Low Voltage mode operation, the secondary electron beam is directed by stronger Wien filter deflections toward the low voltage secondary electron detector 160 that may be the same detector used for backscatter imaging at high voltage. Further detail on the system and its operation is described in the Meisberger patent.

FIG. 1B is a diagram illustrating conventional raster electron beam scanning by a scanning electron microscope. As shown, an electron beam spot 152 is scanned 154 over a specimen 20 (for example, a semiconductor wafer) or a portion of a specimen. In the example illustrated, the raster pattern is a zig-zag pattern in the plane of the specimen (the x-y plane). Consider a spot with an effective size S, and an area needing to be scanned of length X in the x-dimension. In that case, X/S (X divided by S) rows would in principle need to be scanned to cover that area. The resolution of the SEM depends on the effective size of the spot.

Unfortunately, conventional SEM systems have their limitations. In particular, as feature sizes in semiconductor circuits continue to shrink, wafer inspection systems need to scan at higher and higher resolutions. For example, recent semiconductor manufacturing processes have 0.18 micron, 0.15 micron, and 0.13 micron linewidths. Future processes will have even smaller linewidths.

The need for such higher resolutions implies the need for smaller spot dimensions of the electron beam as it impinges upon the wafer. The smaller the spot size, the higher the resolution. Submicron spot sizes (for example, 0.5 micron, 0.2 micron, 0.15 micron, 0.1 micron, 0.05 micron, or less) are desirable to inspect features or defects of semiconductors.

Such smaller spot sizes require faster scanning speeds in order to keep inspection times per wafer reasonable. For example, recent semiconductor wafers have diameters of 200 mm or 300 mm. Future wafers will be even larger. To provide the smaller spot sizes at higher scanning speeds, higher beam current densities will be required. Higher beam current density produces greater space-charge repulsion between electrons in the beam. This tends to expand the beam, limiting the achievable beam density at the wafer. The beam spot cannot be given arbitrarily higher current density. Wafer inspection systems using conventional SEM technology are thus limited in their speed.

One possible approach to overcome the above-described problem is a projection system, where a large spot rather than a small one is formed at the wafer, and the secondary electrons from this spot are imaged onto a two-dimensional detector. Such an approach is described in U.S. Pat. No. 5,973,323, "Apparatus and Method for Secondary Electron Emission Microscope," issued to Adler et. al and assigned to KLA-Tencor Corporation of San Jose, Calif. However, while such systems are workable, they present added complexities in terms of wafer charging control, beam intensity uniformity, and image aberrations.

SUMMARY

Figure 1A:
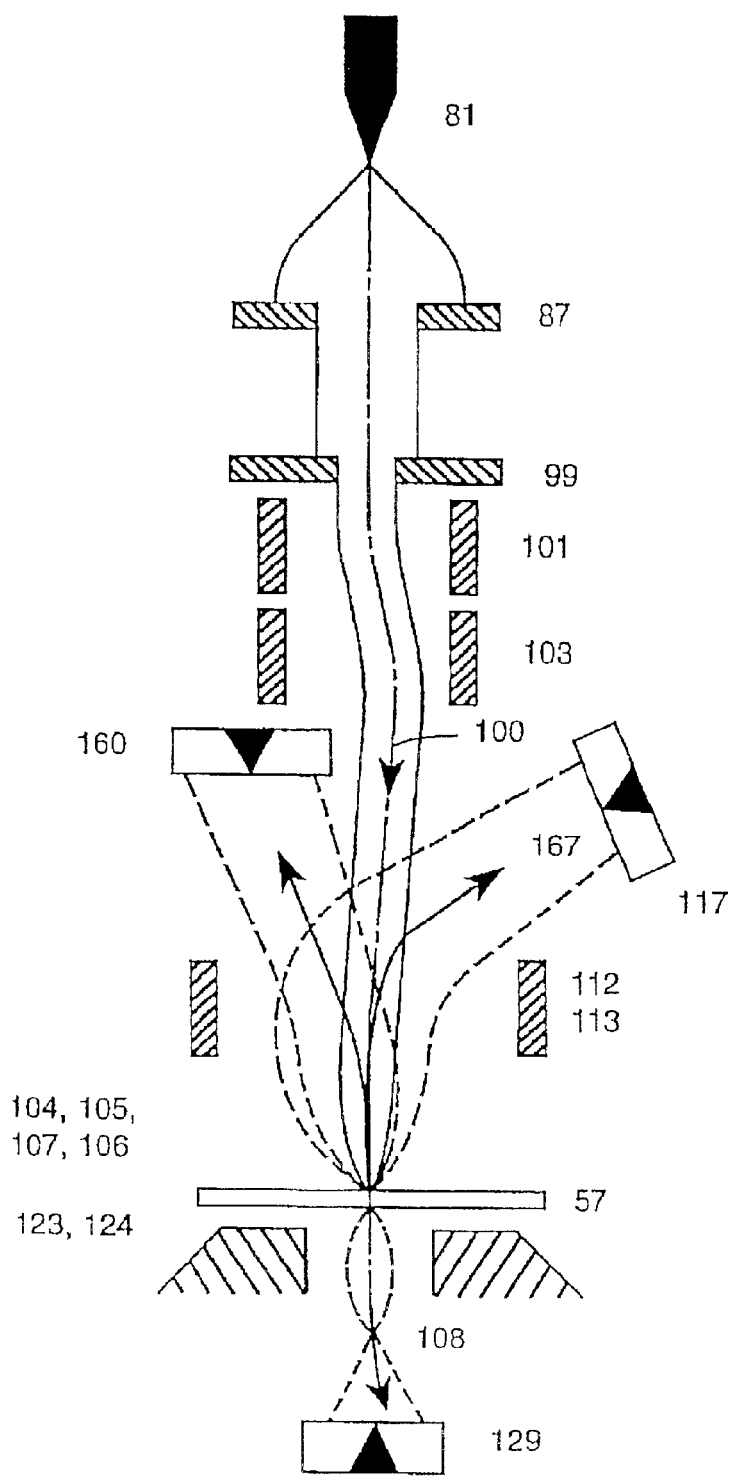
FIG. 1A is a simplified schematic representation of the paths of the primary, secondary, back-scatter and transmitted electrons through the electron optical column and collection system for electron beam inspection.
Figure 1B:
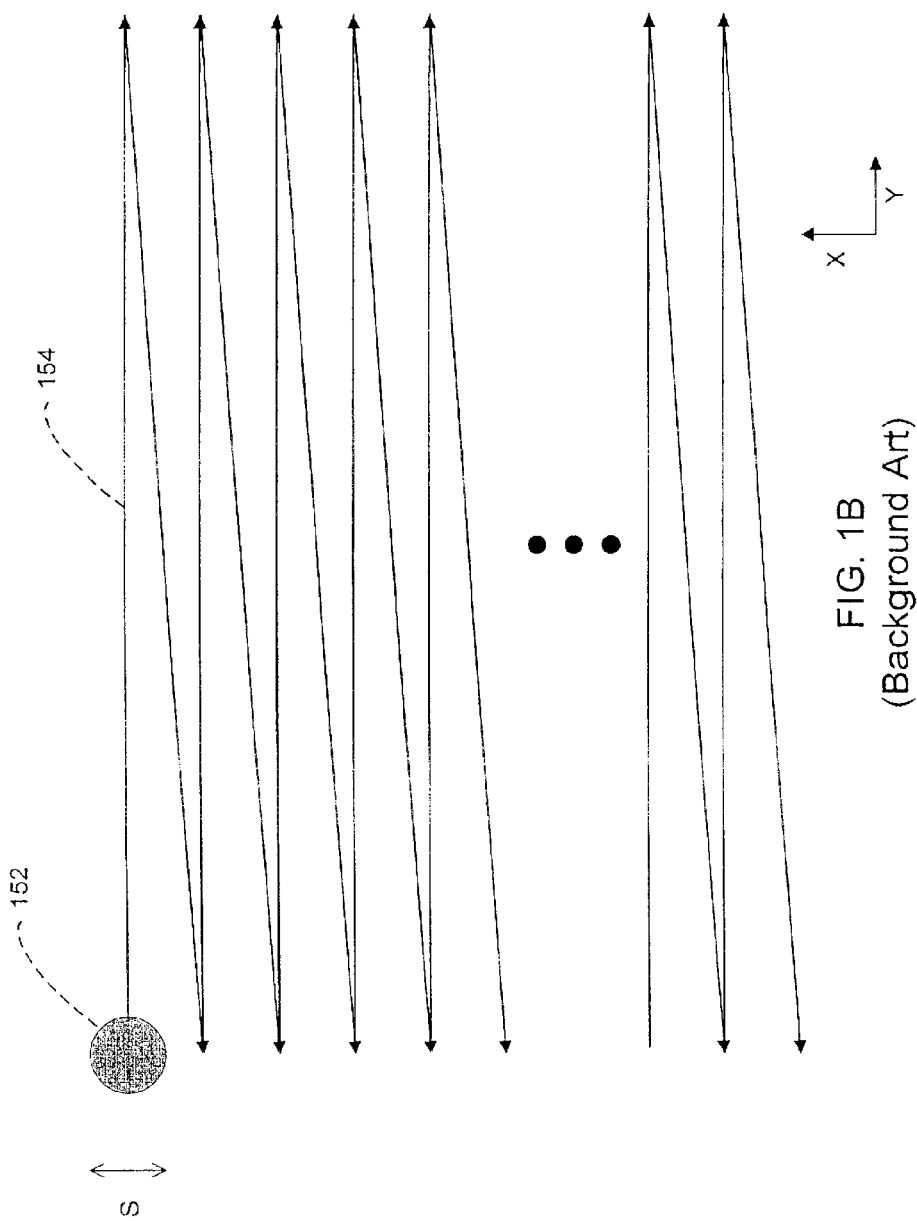
FIG. 1B is a diagram illustrating conventional raster electron beam scanning by a scanning electron microscope.

Apparatus configurations are provided for generating a ribbon-like beam that impinges onto a target specimen as an elongated spot. The elongated spot has a first dimension that is substantially elongated in comparison to a second dimension. The configuration may be non-axisymmetric and include means for point-to-parallel focusing in the first dimension and point-to-point focusing in the second dimension. In accordance with one embodiment, the apparatus may include a first lens subsystem for transforming the electron beam into an intermediate-stage beam, and a second lens subsystem for focusing the intermediate-stage beam into the elongated spot. Methods are discussed for focusing the electron beam into the elongated spot. In accordance with one embodiment, a method may include transforming the electron beam into an intermediate-stage beam, and focusing the intermediate-stage beam into a ribbon-like beam that impinges onto a target specimen as an elongated spot.

DETAILED DESCRIPTION

As described above, the point-shaped spot probe created by conventional scanning electron microscopes leads to space-charge limitations at higher resolutions. In order to circumvent these limitations, techniques to achieve an elongated spot (one-dimensional illumination) are desirable. For example, the elongated spot may be one hundred times (or one thousand times or more) longer in a first dimension than in a second dimension. Effectively, such an elongated spot would be effectively equivalent to one hundred (or one thousand or more) point-shaped spots being illuminated in parallel. Scattered signals from such an elongated spot may be received in parallel for processing using a one-dimensional array detector.

Note that the term scattered beam (or scattered signal, or scattered electrons, and the like) is used in this specification to refer to electrons scattered from a specimen as a result of impingement of a primary beam onto the specimen. In typical inspection applications, the scattered beam is primarily composed of secondary electrons. Other types of scattered electrons include backscattered electrons. Backscattered electrons may also be used in inspection applications.

One technique to achieve an elongated spot probe (one-dimensional illumination) is to use an axisymmetric system. Such a system has a lens configuration that is configured to be symmetrical about the beam axis. Since the system is symmetric about the beam axis, a line (instead of point) source must be used for the electron source in order to achieve the one-dimensional illumination. However, such an axisymmetric system has disadvantages. For example, by Scherzer's theorem, third order aberrations cannot be eliminated in an axisymmetric system.

In the description below, non-axisymmetric systems are described to achieve the one-dimensional illumination. Advantageously, such systems may be configured to correct second and third order aberrations through use of high-order multipoles (see the sextupole lenses described in U.S. Pat. Nos. 4,303,864, 4,389,571, and 4,414,474) and through symmetry considerations (see Brown, Karl L., "First- and Second-Order Charged Particle Optics," SLAC-PUB-3381, Stanford Linear Accelerator Center, Stanford, Calif., July 1984—while this publication only goes as high as second-order corrections, the analysis has been extended to third-order corrections).

Figure 2:
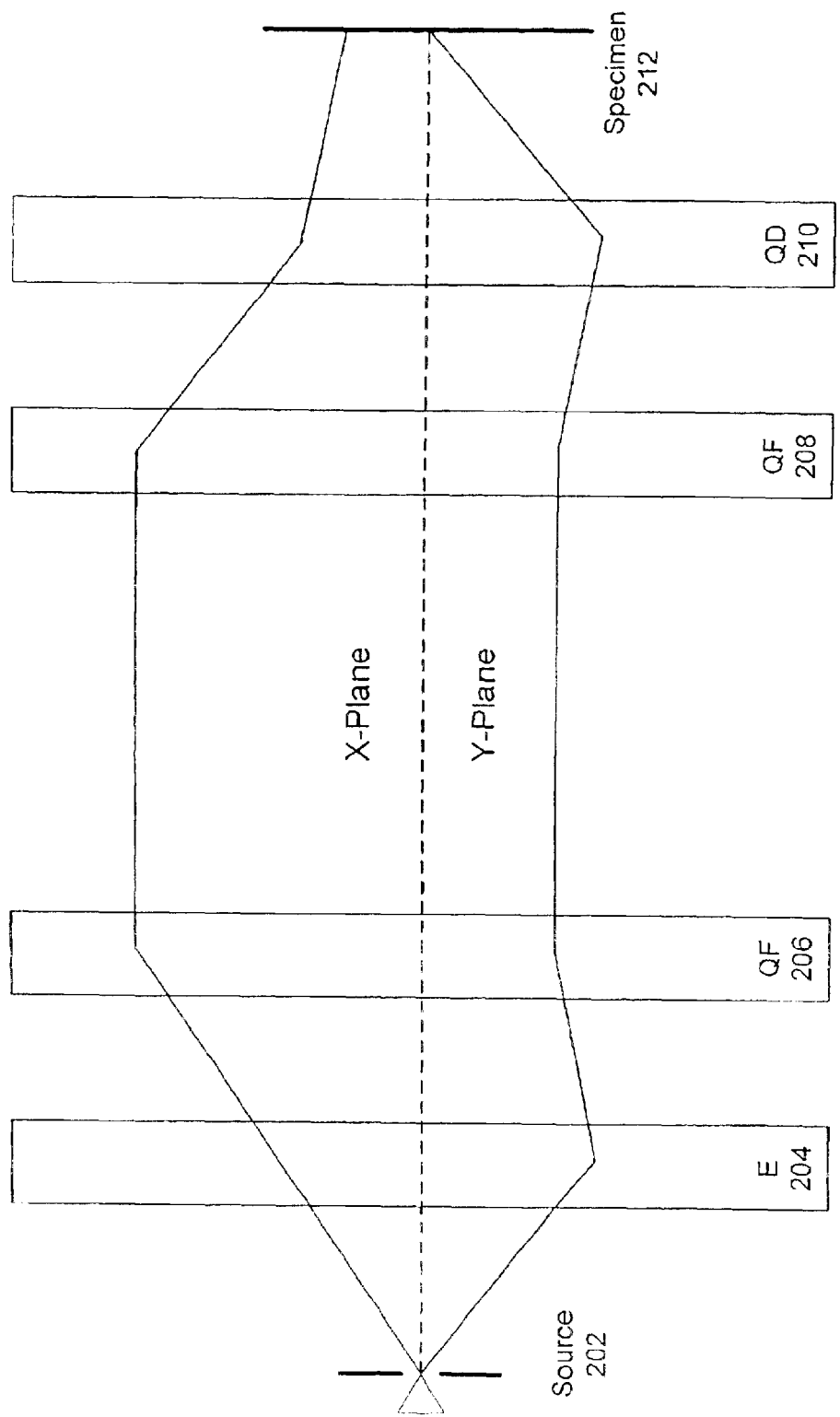
FIG. 2 is a beam-profile diagram of an electron beam focusing configuration in accordance with a first embodiment of the invention.

FIG. 2 is a beam-profile diagram of an electron beam focusing configuration in accordance with a first embodiment of the invention. The configuration shown in FIG. 2 includes four lenses. The four lenses are an Einzel lens 204, a first quadrupole focusing (QF) lens 206, a second quadrupole focusing (QF) lens 208, and a quadrupole de-focusing (QD) lens 210.

The electron source 202 generates an electron beam. The source 202 may be implemented, for example, using a thermionic (hot) source. Other sources may also be used, such as a field emission (cold) source. Although an aperture may be used to limit highly divergent angles of the beam from the sournce 202, the beam remains divergent in nature.

Since the subsequent lens configuration is non-axisymmetric, the electron source 202 may be a point-like (symmetric) source. However, an asymmetric source may be desirable and has advantages. For example, the asymmetric source may be a linear source where the emittance of electrons is spread out along a first dimension in comparison to a second dimension. For example, such a linear source may comprise a linear gun or a linear array of point-like sources. Alternatively, a point-like source may be used in conjunction with transformation lenses to make the emittance to be non-symmetric (e.g., linear) in form.

The electron beam enters into the region of the Einzel lens 204 and the first QF lens 206. These lenses convert or focus the electron beam from a divergent beam into a quasi-parallel beam. The quasi-parallel beam need not be completely parallel (although it is more nearly parallel than the divergent beam from the source 202).

The Einzel lens 204 may comprise a one-dimensional slot-type Einzel lens. One implementation of such an Einzel lens and its use in a mass spectrometer is described in U.S. Pat. No. 5,013,923. The Einzel lens 204 is configured and applied to focus (reduce the divergence) in the y-plane, as illustrated in the bottom half of FIG. 2, without affecting the beam divergence in the x-plane, as illustrated in the top half of FIG. 2.

Quadrupole lenses are non-axisymmetric devices. Advantageously, non-axisymmetric devices (such as quadrupole lenses) can provide strong focusing capabilities while typically having lower aberrations than axisymmetric devices (such as Einzel lenses and solenoid lenses). In principle, use of non-axisymmetric devices also allows for correction of second and third order aberrations.

A quadrupole lens may be configured to focus a beam in one direction while it de-focuses the beam in a perpendicular direction. In this description, a quadrupole lens is designated as a QF lens if it focuses (reduces divergence) of the beam in the x-plane, and a quadrupole lens is designated as a QD lens if it de-focuses (increases divergence) of the beam in the x-plane.

Figure 5:
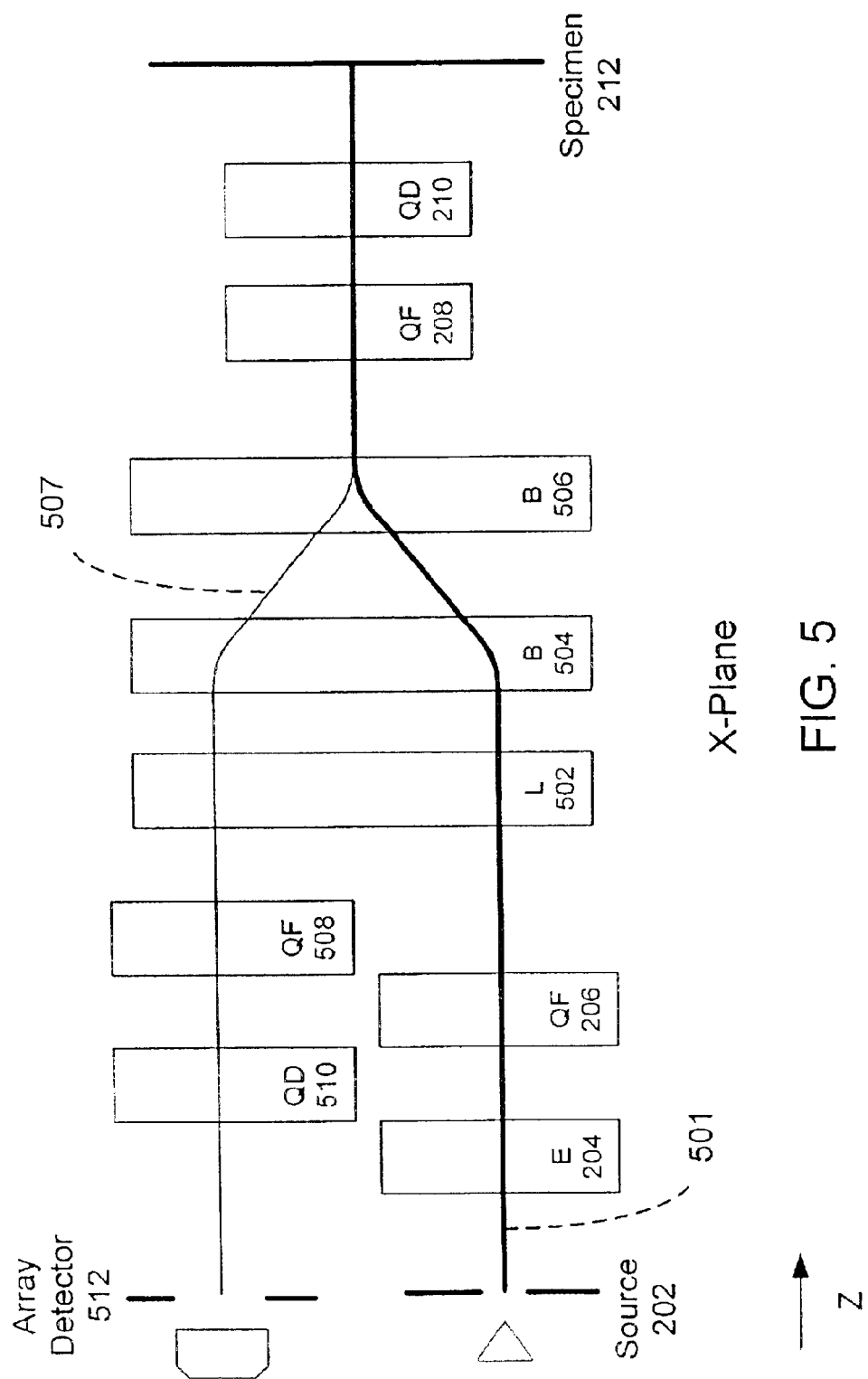
FIG. 5 is an x-plane cross-sectional diagram of one configuration for separating the primary and scattered electron beams in accordance with the first embodiment of the invention.

The first QF lens 206 receives the beam from the Einzel lens 204. The first QF lens 206 focuses the beam in the x-plane, as shown in the top half of FIG. 2, while it defocuses the beam in the y-plane, as shown in the bottom half of FIG. 2. The result is what we are calling an intermediate-stage beam. In this case, the intermediate-stage beam is a quasi-parallel beam. The path of the quasi-parallel from the first QF lens 206 to the second QF lens 208 may not exactly be straight. For example, as illustrated in FIG. 5, the path may include one or more bends and intervening devices.

The quasi-parallel beam enters into the region of the second QF lens 208 and the QD lens 210. These two lenses may be considered to operate as an objective lens. The second QF lens 208 receives the quasi-parallel beam and continues to focus the beam in the x-plane, as shown in the top half of FIG. 2, while it defocuses the beam in the y-plane, as shown in the bottom half of FIG. 2. Finally, the QD lens 210 receives the beam. The QD lens 210 strongly focuses the beam in the y-plane, as shown in the bottom half of FIG. 2, while it de-focuses the beam in the x-plane, as shown in the top half of FIG. 2. The result is a ribbon-like beam in that it is wide in the x-dimension while being focused in the y-dimension. As the ribbon-like beam approaches the specimen 212, it gets narrower in the y-dimension. When the ribbon-like beam impinges upon the specimen 212, it forms an elongated spot. The specimen 212 may be, for example, a substrate such as a semiconductor wafer. Of course, other specimen types may be used. The elongated spot is much wider in the x-dimension than it is in the y-dimension. The focusing apparatus should be configurable such that the elongated spot may be 10, 50, 100, 500, or 1000 times or more wider in the x-dimension than it is in the y-dimension.

Figure 3:
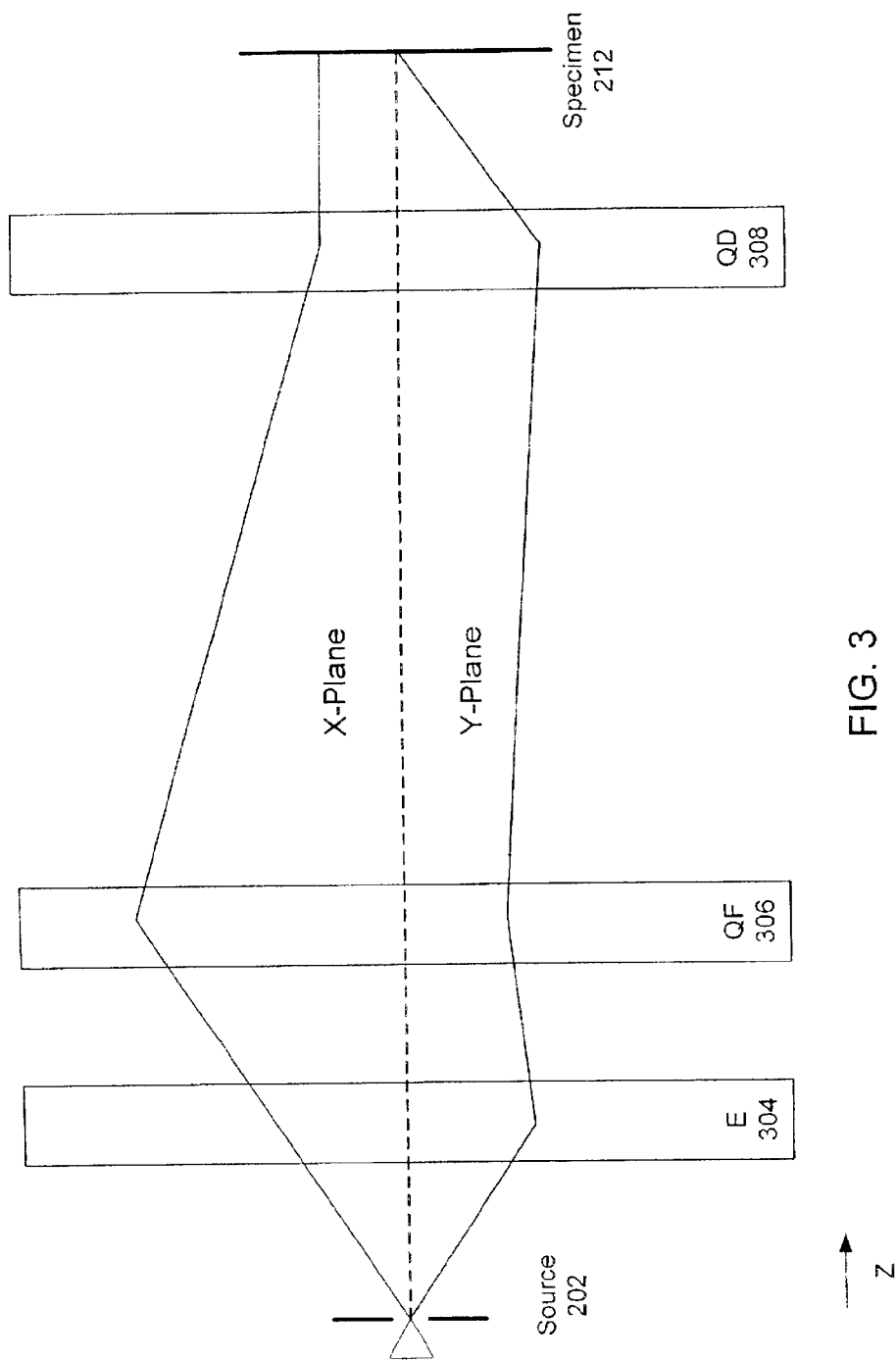
FIG. 3 is a beam-profile diagram of an electron beam focusing configuration in accordance with a second embodiment of the invention.

FIG. 3 is a beam-profile diagram of an electron beam focusing configuration in accordance with a second embodiment of the invention. The configuration shown in FIG. 3 includes three lenses. The three lenses are an Einzel lens 304, a quadrupole focusing (QF) lens 306, and a quadrupole de-focusing (QD) lens 308.

The function of the Einzel lens 304 and the QF lens 306 in FIGS. 3A and 3B are similar to the function of the Einzel lens 204 and first QF lens 206 in FIG. 2. The Einzel lens 304 is configured and applied to reduce the divergence in the y-plane, as illustrated in the bottom half of FIG. 3, without increasing the beam divergence in the x-plane, as illustrated in the top half of FIG. 3. The QF lens 306 focuses the beam in the x-plane, as shown in the top half of FIG. 3, while it defocuses the beam in the y-plane, as shown in the bottom half of FIG. 3. Note that the intermediate-stage beam resulting from the QF lens 306 in the top half of FIG. 3 is more convergent in the x-plane than the quasi-parallel beam resulting from the first QF lens 206 in the top half of FIG. 2. (In addition, the intermediate-stage beam resulting from the QF lens 306 in the top half of FIG. 3 may be to a lesser extent less parallel and more divergent in the y-plane than the quasi-parallel beam resulting from the first QF lens 206 in the top half of FIG. 2.) This may accomplished, for example, by strengthening the QF lens 306. The intermediate-stage beam out of the QF lens 306 is made to be convergent in the x-plane because it goes to the QD lens 308 without an intervening QF lens.

The intermediate-stage beam enters into the region of the QD lens 308. The QD lens 308 may be considered to operate as an objective lens. The QD lens 308 receives the intermediate-stage beam and strongly focuses the beam in the y-plane, as shown in the bottom half of FIG. 3, while it de-focuses the beam in the x-plane, as shown in the top half of FIG. 3. The result is a ribbon-like beam in that it is wide in the x-dimension while being focused in the y-dimension. As the ribbon-like beam approaches the specimen 212, it gets narrower in the y-dimension. When the ribbon-like beam impinges upon the specimen 212, it forms an elongated spot that is much wider in the x-dimension than it is in the y-dimension. Again, the focusing apparatus should be configurable such that the elongated spot may be 10, 50, 100, 500, or 1000 times or more wider in the x-dimension than it is in the y-dimension.

Figure 4:
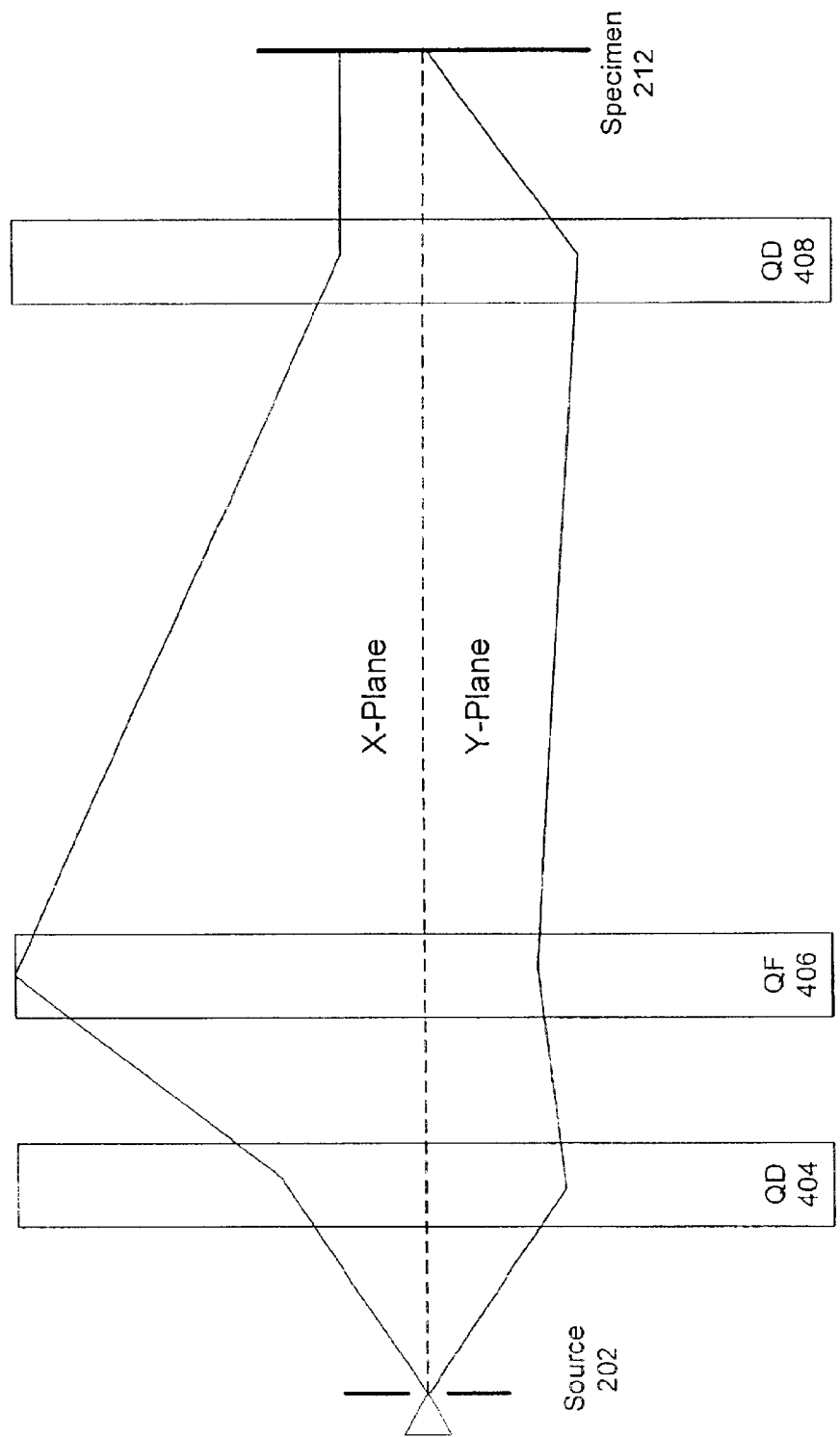
FIG. 4 is a beam-profile diagram of an electron beam focusing configuration in accordance with a third embodiment of the invention.

FIG. 4 is a beam-profile diagram of an electron beam focusing configuration in accordance with a third embodiment of the invention. The configuration shown in FIG. 4 includes three lenses. The three lenses are a first quadrupole de-focusing (QD) lens 404, a quadrupole focusing (QF) lens 406, and a second quadrupole de-focusing (QD) lens 408.

The first QD lens 404 is configured and applied to reduce the divergence in the y-plane, as illustrated in the bottom half of FIG. 4, while it de-focuses the beam in the x-plane, as illustrated in the top half of FIG. 4. The result is quite divergent in the x-plane. The QF lens 406 focuses the beam in the x-plane, as shown in the top half of FIG. 4, while it defocuses the beam in the y-plane, as shown in the bottom half of FIG. 4. The intermediate-stage beam out of the QF lens 406 is made to be convergent in the x-plane because it goes to the QD lens 408 without an intervening QF lens.

The intermediate-stage beam enters into the region of the QD lens 408. The QD lens 408 may be considered to be an objective lens. The QD lens 408 receives the intermediate-stage beam and strongly focuses the beam in the y-plane, as shown in the bottom half of FIG. 4, while it de-focuses the beam in the x-plane, as shown in the top half of FIG. 4. Again, the result is a ribbon-like beam in that it is wide in the x-dimension while being focused in the y-dimension. As the ribbon-like beam approaches the specimen 212, it gets narrower in the y-dimension. When the ribbon-like beam impinges upon the specimen 212, it forms an elongated spot that is much wider in the x-dimension than it is in the y-dimension. Again, the focusing apparatus should be configurable such that the elongated spot may be 10, 50, 100, 500, or 1000 times or more wider in the x-dimension than it is in the y-dimension.

In addition to the embodiments described above in relation to FIGS. 2A/2B, 3A/3B, and 4A/4B, other embodiments are contemplated that modify the lens configurations. For example, although using quadrupole lenses to form the objective lenses is advantageous in terms of reducing aberrations, depending on detailed geometry of a given system, it may be desirable to use a slot Einzel lens (instead of a quadrupole lens) to limit beam divergence. Similarly, it may be desirable to combine a quadrupole lens or a slot Einzel lens with a solenoid lens to limit beam divergence.

Furthermore, additional elements or features may be desirable which are not shown to maintain clarity in the figures. For example, an immersion-type lens may be desirable in order to decelerate the primary beam just before the specimen 212 and to accelerate the secondary electrons.

FIG. 5 is an x-plane cross-sectional diagram of one configuration for separating the primary 501 and scattered 507 electron beams in accordance with the first embodiment of the invention. The configuration shown in FIG. 5 includes a dual bend in the x-plane (the plane of the first or elongated dimension). Bending in the x-plane is advantageous in that higher order aberrations introduced by an x-plane bend will not introduce curvature in the primary beam spot, while a y-plane bend may do so. In addition, chromatic aberrations due to an x-plane bend will not widen the size of the spot in the y-plane (the second dimension).

Various elements are added to the configuration of FIG. 2 (and the lens placements of FIG. 2 are shifted) to create FIG.

5. In particular, FIG. 5 shows the addition of Lambertson-style magnet (L) 502, a first bending magnet (B) 504, a second bending magnet (B) 506, an additional quadrupole focusing (QF) lens 508, an additional quadrupole de-focusing (QD) lens 510, and an array detector 512.

Following the primary beam 501 as it travels from the source 202, the primary beam 501 is not affected by the Lambertson magnet 502. (The Lambertson magnet 502 affects the scattered signal 507 as described below. For the first discussion of this magnet type, see 200 *BEV Accelerator Design Study*, University of California Lawrence Radiation Laboratory, UCRL-16000, June, 1965, Vol. 1, p. X-4 and Vol. 2, FIG. X-3.) Note that instead of a Lambertson-style magnet, a current septum magnet or an electrostatic septum deflector could also be used for the same purpose. The primary beam 501 is then bent by the two bending magnets (B) 504 and 506. The bending magnets may comprise, for example, magnetic dipoles. As illustrated in FIG. 5, these magnets may be configured to bend the primary beam 501 in the x-plane such that the primary beam 501 is directed via the objective lens towards the specimen 212. In this particular configuration, the dual-bend results in an overall angular deflection of zero for the primary beam 501 (and also for the scattered beam 507).

Following the scattered beam 507 as it travels from the specimen 212, the scattered beam 507 is bent by the two bending magnets (B) 506 and 504. As illustrated in FIG. 5, the scattered beam 507 is separated from the primary beam 501 by the first bending magnet 506 that the scattered beam 507 encounters. The separation occurs because the velocity vectors of the primary beam 501 and of the scattered beam 507 are different (and in fact point in opposite directions). The second bending magnet 504 that the scattered beam 507 encounters deflects the scattered beam 507 such that an overall angular deflection of zero is achieved. The zero angular deflection may be advantageous in that it zeros the dispersion slope (angles caused by off-energy scattered electrons). Hence, when the scattered beam 507 is eventually imaged onto the array detector 512, there should not be a reduction in x-dimension resolution due to scattered electron energy spread.

In this particular embodiment, prior to the scattered beam 507 reaching the array detector 512, the Lambertson magnet 502 operates to deflect the scattered beam 507 in the y-plane (without affecting the primary beam 501). The deflection angle in the y-plane may be fairly large. This will induce energy dispersion in the scattered electrons in the y-plane. The dispersion can either be cancelled by a subsequent lens system, or it can be used to filter the scattered electrons by energy.

The array detector 512 is configured to receive the scattered beam 507. Since the scattered beam 507 is spread out in the x-dimension, the array detector 512 should have elements that are also spread in the x-dimension. The array detector 512 may be a one-dimensional array of detecting elements. Alternatively, it may be a two-dimensional array of detecting elements that is configured to act as a one-dimensional array (by effectively grouping elements along a perpendicular dimension).

Figure 6:
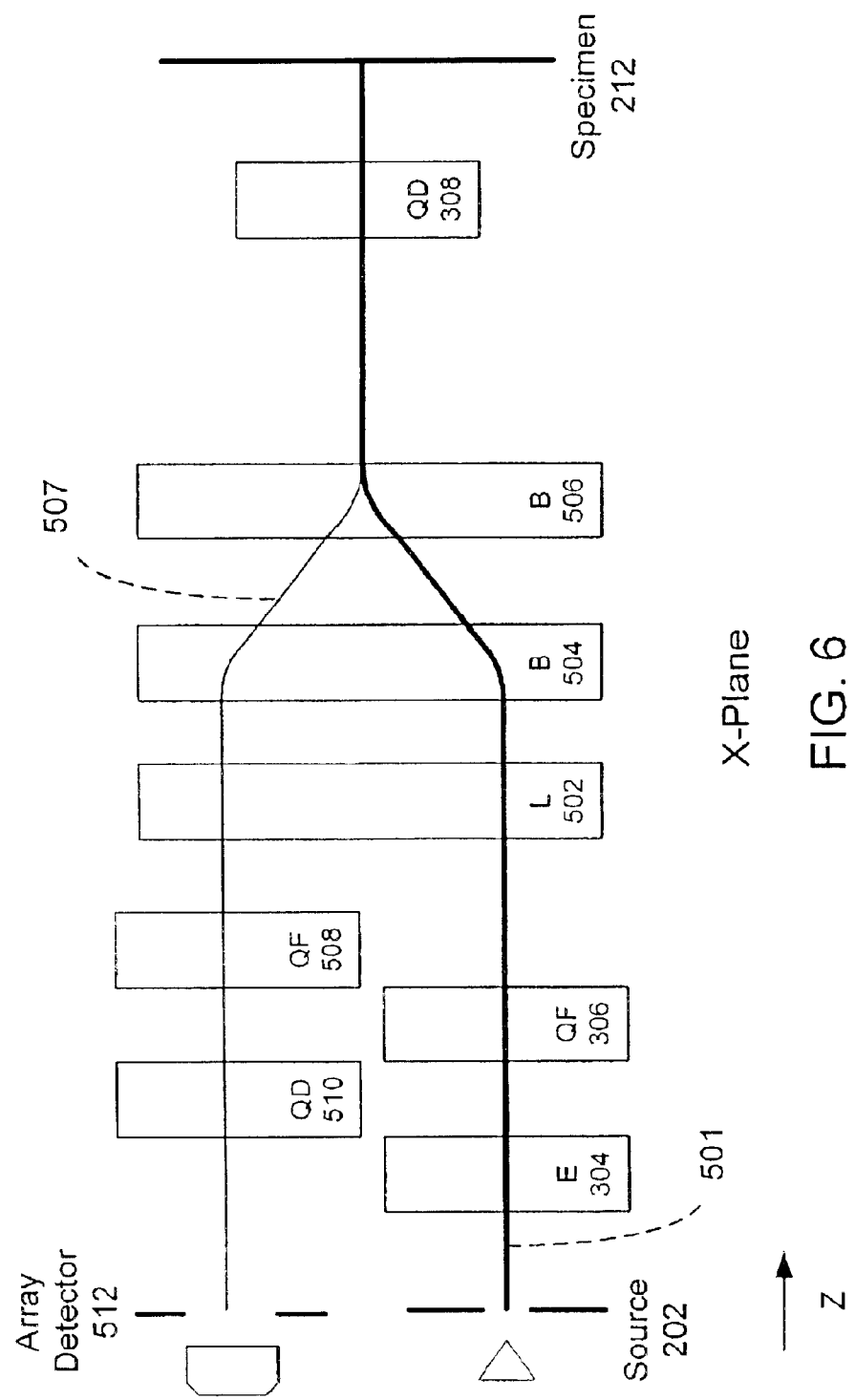
FIG. 6 is an x-plane cross-sectional diagram of one configuration for separating the primary and scattered electron beams in accordance with the second embodiment of the invention.

FIG. 6 is an x-plane cross-sectional diagram of one configuration for separating the primary 501 and scattered 507 electron beams in accordance with the second embodiment of the invention. Like FIG. 5, FIG. 6 includes a dual bend in the x-plane (the plane of the elongated dimension). Various elements added to the configuration of FIG. 3 (and the lens placements of FIG. 3 are shifted) to create FIG. 6. The elements added (502, 504, 506, 508, 510, and 512) are the same as those added in FIG. 5, and the operation of those additional elements are as described above in relation to FIG. 5.

Figure 7:
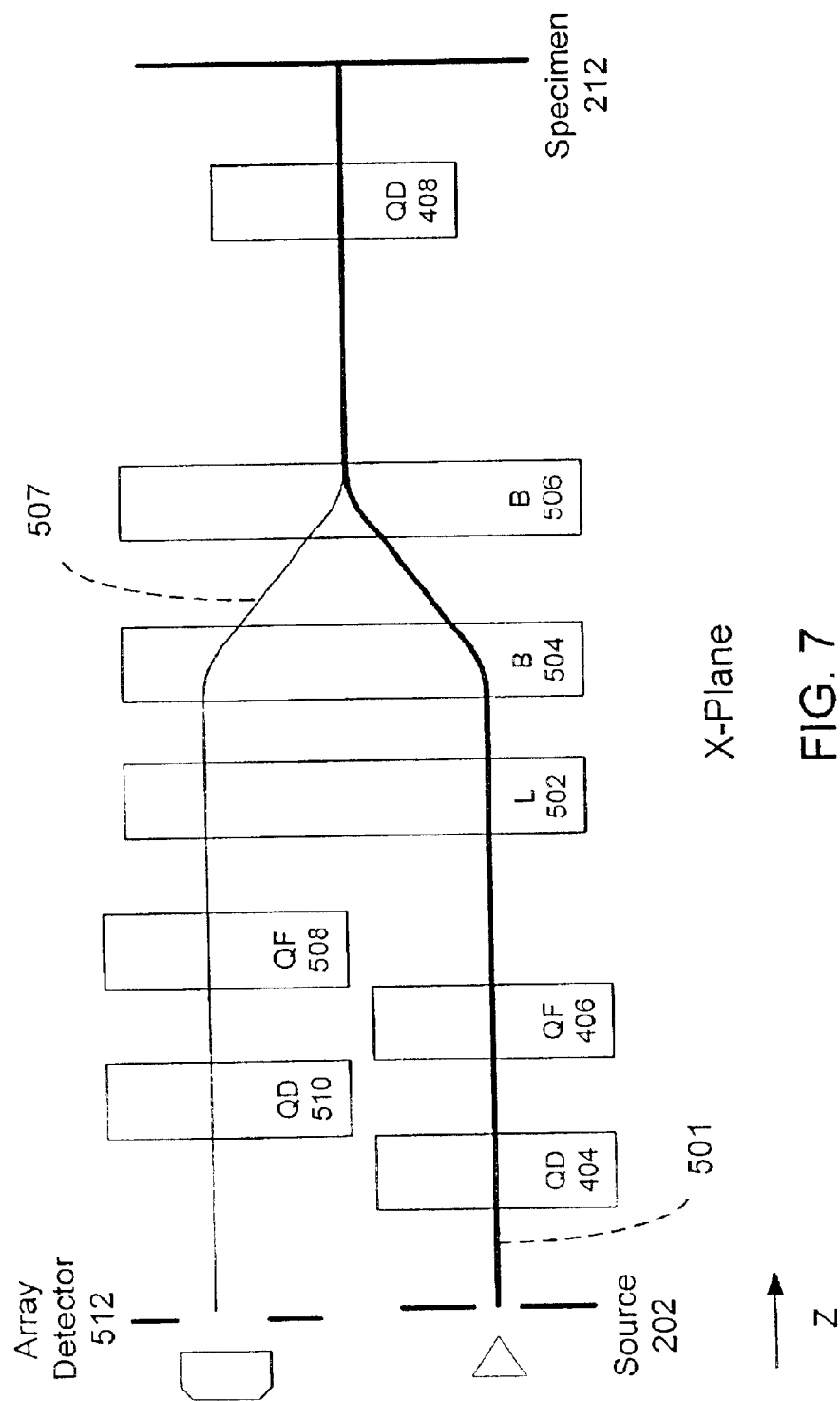
FIG. 7 is an x-plane cross-sectional diagram of one configuration for separating the primary and scattered electron beams in accordance with the third embodiment of the invention.

FIG. 7 is an x-plane cross-sectional diagram of one configuration for separating the primary 501 and scattered 507 electron beams in accordance with the third embodiment of the invention. Like FIG. 5, FIG. 7 includes a dual bend in the x-plane (the plane of the elongated dimension). Various elements added to the configuration of FIG. 4 (and the lens placements of FIG. 4 are shifted) to create FIG. 7. The elements added (502, 504, 506, 508, 510, and 512) are the same as those added in FIG. 5, and the operation of those additional elements are as described above in relation to FIG. 5.

Figure 8:
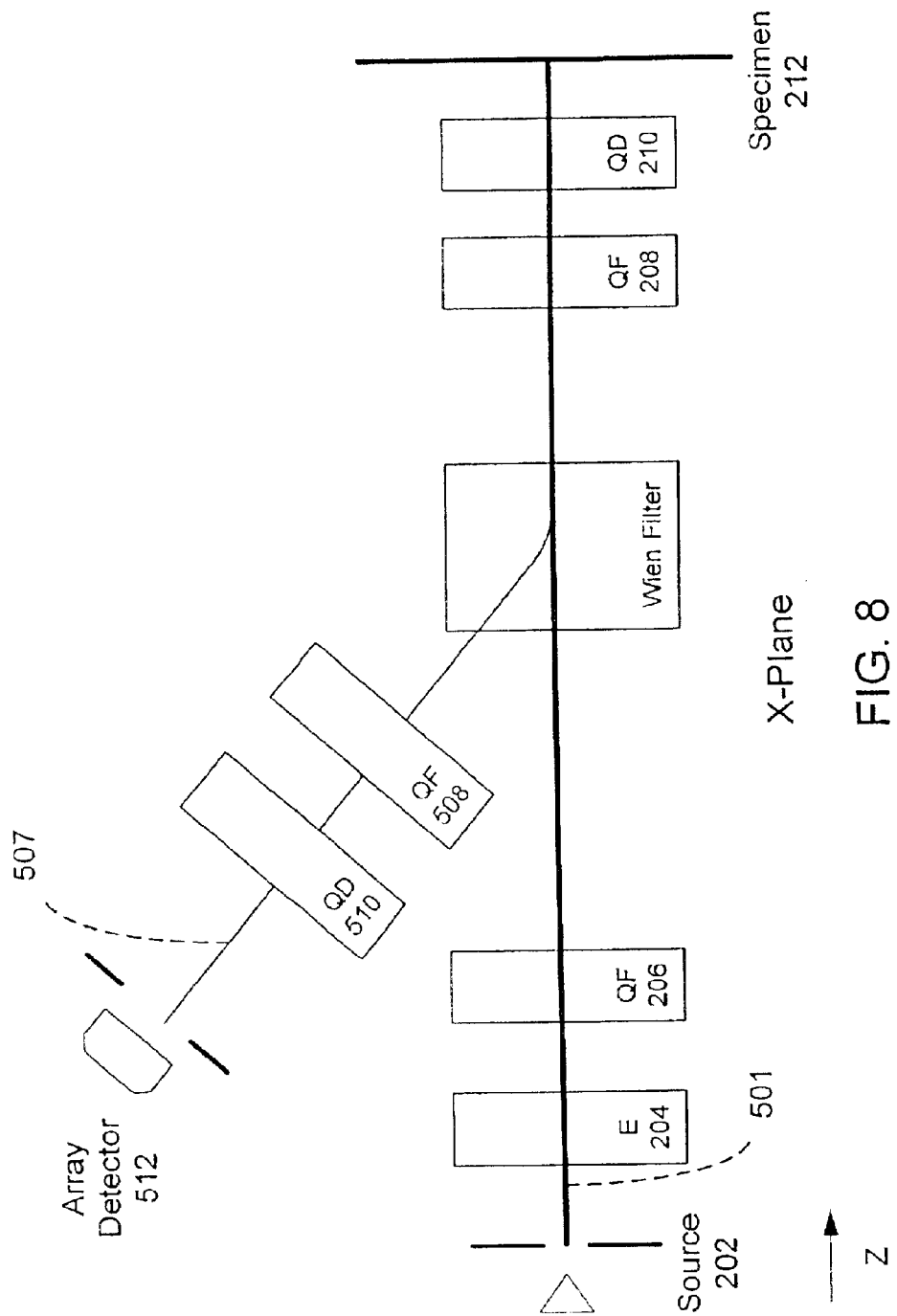
FIG. 8 is an x-plane cross-sectional diagram of a configuration using a Wien filter for separating the primary and scattered scattered electron beams in accordance with the fourth embodiment of the invention.

In another embodiment, a Wien velocity filter may be used to separate the primary beam 501 and the scattered signal 507. Such an embodiment is depicted in FIG. 8. The deflection of the scattered signal may be in the x-plane, as shown, or (preferably) in the y-plane. (Deflection in the y-plane does not introduce x-plane dispersion in the scattered beam, simplifying the task of imaging the wafer onto the array detector in the x-dimension.)

FIGS. 5–8 describe some possible techniques to separate the primary 501 and scattered 507 electron beams. Various other techniques may also be used. For example, a dual bend such as in FIGS. 5–7 is not necessary, and in an alternate embodiment a single bend configuration may be used instead.

In addition to the elements illustrated in the above-described figures, other elements or features may be included in different embodiments. For example, a pair of x and y steering elements may be included for beam alignment. In addition, a weak skew quadrupole lens (stigmator) may be included to help in adjusting beam focus and to compensate for any mixing between the x and y dimensions. Furthermore, a weak sextupole lens may be included to assist in correcting second order aberrations introduced by the bends. Various other correction elements may also be included.

Moreover, other embodiments may strengthen the lenses to create a crossover in one or both planes near the center region of the system, rather than using the parallel beam arrangement of the above figures. One specific embodiment may utilize such a crossover and add a pair of correction sextupole lenses separated by 180 degrees in phase advance. In other words, an object at one corrector will be imaged onto the other corrector, in one or both planes. (See Brown, Karl L., "First- and Second-Order Charged Particle Optics," section 5, SLAC-PUB-3381, Stanford Linear Accelerator Center, Stanford, Calif., July 1984; and Brown, Karl L., "A Second-Order Magnetic Optical Achromat," SLAC-PUB-2257, Stanford Linear Accelerator Center, Stanford, Calif., February 1979.) The correctors may be ganged and adjusted together to trim second order errors. This adjustment will not affect second-order geometric properties in the plane(s) which have the crossover condition, but will affect second-order chromatic properties of the beam in both planes.

Other embodiments may use a method of equalizing the beam current along the x-dimension at the specimen. This could be accomplished in various ways. For example, if the system is given a cross-over in the y-dimension, then a linear array of deflectors at this intermediate y-image location may be used to deflect current into a downstream field aperture slit in the y-dimension. In another embodiment, a linear array of point-like sources could be used with either individual adjustment of each source current or with deflectors which again deflect current into a downstream field aperture slit. Another embodiment accomplishes the equalization using a set of weak, high-order multipole lenses (for example, sextupole, octupole, decapole, and dodecapole lenses) to form a high-order linear multipole trimmer. (See U.S. Pat. No. 5,350,926.)

The systems illustrated above depict an angle of incidence normal to the plane of the specimen. Such a normal angle is typically useful, for example, for initial inspections of semiconductor wafers. However, other embodiments may utilize other angles of incidence. For example, the angle of incidence may be deliberately offset from normal to induce "shadowing." This can be achieved either by tilting the projection axis about the line scan on the specimen so that the plane of incidence is non-normal to the specimen, or by tilting the projection axis so that the plane of incidence remains normal to the specimen.

Figure 9:
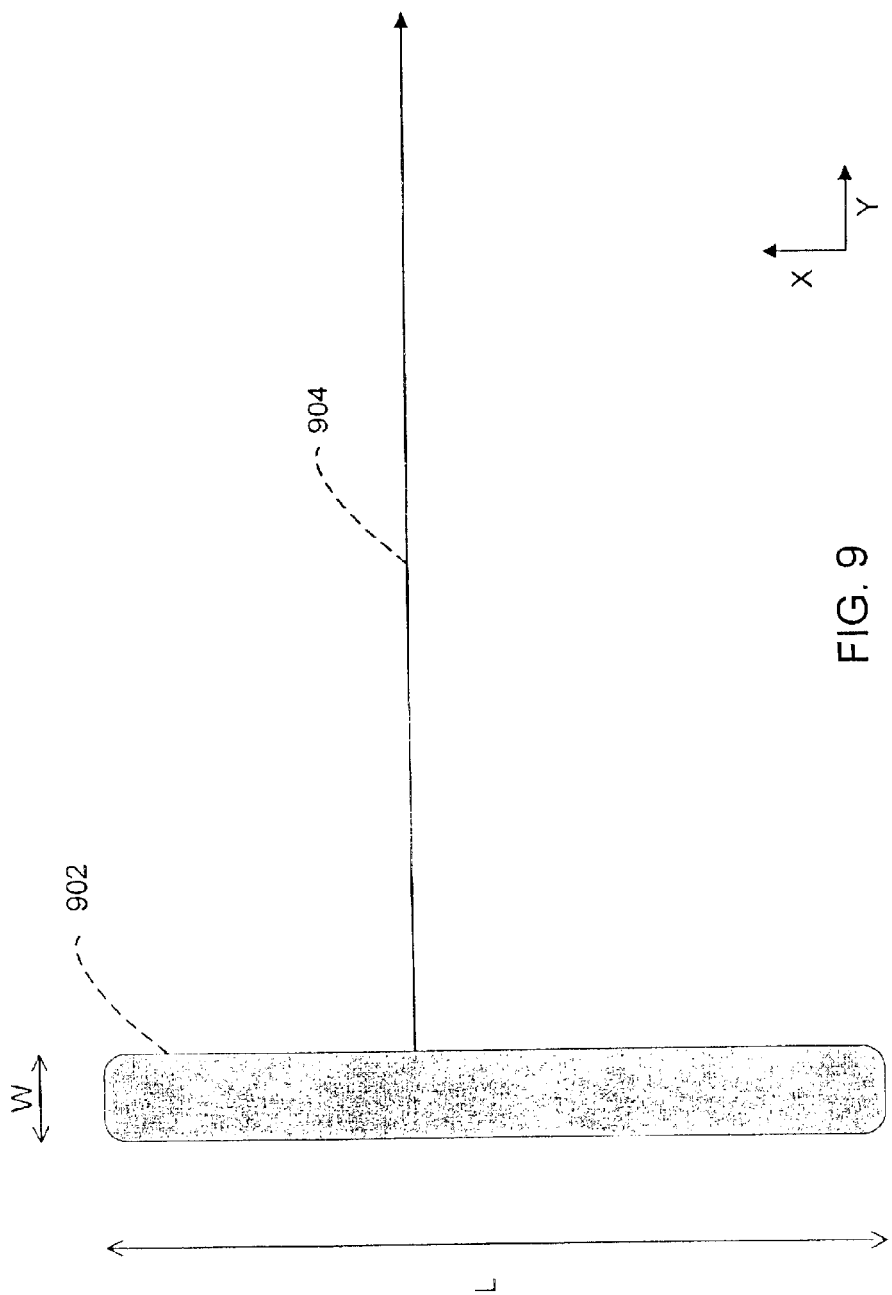
FIG. 9 is a diagram illustrating ribbon electron beam scanning in accordance with an embodiment of the invention.

FIG. 9 is a diagram illustrating ribbon electron beam scanning in accordance with an embodiment of the invention. As shown in the figure, the elongated spot 902 may be much larger in the x-dimension than in the y-dimension. Consider an elongated spot that is of length L in the x-dimension and width W in the y-dimension. The length L may be much greater than the width W.

The elongated spot 902 may be more elongated than as illustrated. For example, the ratio of L/W may be one hundred, or one thousand, or more. In addition, the shape of the elongated spot 902 appears somewhat idealized in the illustration of FIG. 9. The elongated spot 902 may not be quite as uniformly thick in the y-dimension and may taper-off more rapidly at its tips.

The elongated spot 902 may be scanned 904 in the y-dimension across a specimen. Alternatively, the specimen may be scanned below a stationary beam. In comparison with conventional SEM scanning, this advantageously spreads the beam across a larger area and enables faster scanning. In effect, the elongated spot 902 may be used in effect as multiple (one hundred or one thousand or more) point-shaped spots being illuminated in parallel. scattered signals from such an elongated spot may be received in parallel for processing using a one-dimensional array detector. If the elongated spot 902 is not long enough to cover the area to be scanned in one pass, then multiple passes may be used.

The effective resolution of the system in the y-direction depends on the width W of the elongated spot 902. (In the x-direction, it depends on the pixel size in the detector array and the magnification of the secondary electron beam.) This width W may be controlled and adjusted by controlling the strength of the lenses that focus the beam in the y-dimension. For example, the width W may be submicron (for example, 0.5 micron, 0.2 micron, 0.15 micron, 0.1 micron, 0.05 micron, or less) to inspect submicron features or defects of semiconductors. The length L of the elongated spot 902 affects the speed of scans and may be controlled and adjusted by controlling the strength of the lenses that focus the beam in the x-dimension. For example, the length L may be measured in millimeters (for example, 0.05 mm, 0.1 mm, 0.5 mm, 1 mm, 5 mm, or more). The ratio L/W may be 100, or 1000, or more.

Figure 10A:
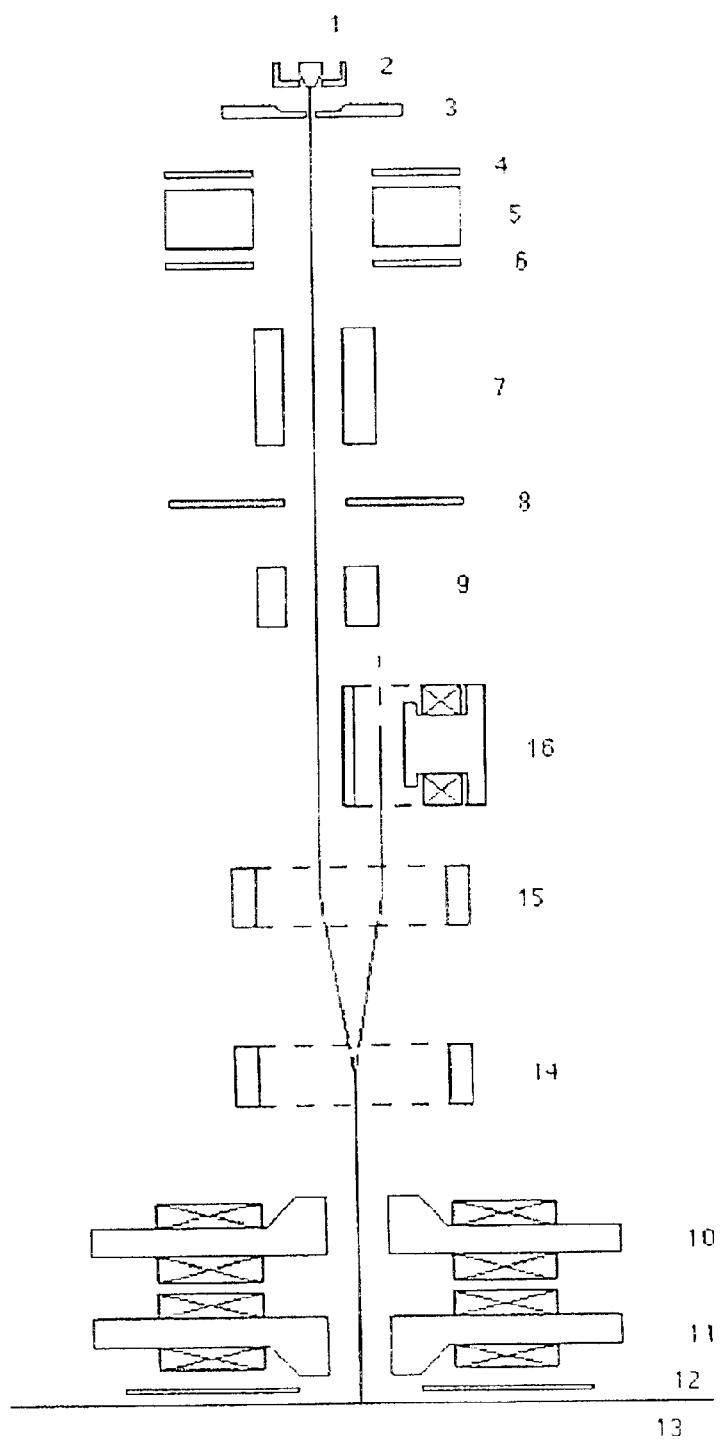
FIG. 10A and FIG. 10B are, respectively, x-plane and y-plane cross-sectional diagrams of an electron beam column and collection system in accordance with an embodiment of the invention.
Figure 10B:
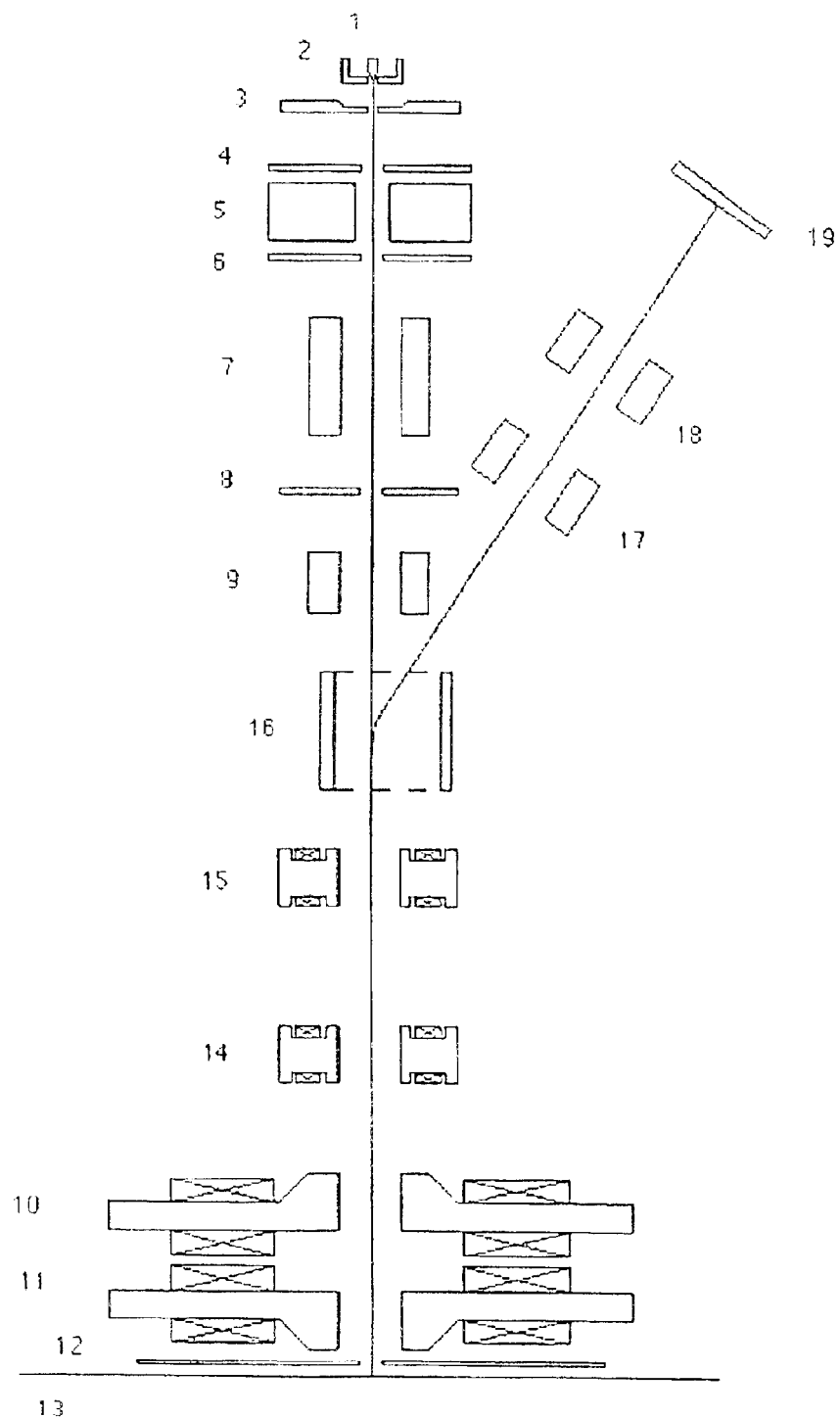

FIG. 10A and FIG. 10B are, respectively, x-plane and y-plane cross-sectional diagrams of an electron beam column and collection system in accordance with an embodiment of the invention. The system includes various components (1–19), as described below, that operate in cooperation with each other to provide the ribbon beam inspection system in an embodiment of the invention.

Component 1 is an electron emission cathode. This may be axisymmetric. For example, it may be larger in the x-dimension than in the y-dimension. Component 2 is an emission control electrode. Component 3 is an anode with an anode aperture.

Components 4–6 are electrodes comprising a slot-type einzel lens, much narrower in the y-direction than in the x-direction. Electrodes 4 and 6 are grounded, while electrode 5 is operated at an elevated potential. This focuses the beam in the y-direction, while not affecting it in the x-direction. Component 7 is a quadrupole lens that focuses the beam in the x-direction (and defocuses in the y-direction). This element can also be used for small beam deflections and for beam blanking. This may be either electric (as shown here) or magnetic. (Note that the combination of elements 4–7 comprises a composite projection lens, replacing elements 95 and 97 in the Meisberger patent.) Component 8 is a beam limiting aperture.

Component 9 is a correction, steering, and scanning assembly. This is composed of an electric multipole assembly (e.g. quadrupole or octupole) and a small magnetic solenoid used as a beam rotator.

Components 10 and 11 are quadrupole lenses. Quadrupole lens 10 is focusing in the x-plane, while quadrupole lens 11 is defocusing in the x-plane. These may be magnetic (as shown here) or electric. They focus the beam to a small size in the y-dimension. Together, they comprise a composite objective lens, replacing elements 104–105 in the Meisberger patent.

Component 12 is a charge control electrode with a slotted aperture. The aperture is much smaller in the y-dimension than in the x-dimension. This electrode allows fine adjustment of the electric field strength at the surface of the specimen. It also provides some focusing in the y-direction. Component 13 is the specimen. It and the charge control electrode 12 are biased at a negative potential. This decelerates the primary electron beam to a reduced beam landing energy, and accelerates secondary electrons to allow them to pass back up the column.

Components 14 and 15 are small dipole magnets used to separate the secondary electron beam from the primary electron beam. Component 16 is a Lambertson-style magnet. This deflects the secondary electron beam in the y-direction, while leaving the primary beam undeflected.

Components 17 and 18 are quadrupole lenses to focus the secondary electron beam. They also allow beam deflection for alignment purposes. Finally, component 19 is a detector assembly. This contains a one-dimensional array of detection elements extending in the x-direction. The specimen is imaged onto the array in the x-direction to provide resolution in this dimension.

Note that the above-described diagrams are intended to illustrate various embodiments. The diagrams are not necessarily to scale. In additions, specific lens currents and other parameters used in the operation of the configurations of lens elements illustrated above will depend on the specific geometries of each particular implementation.

The above-described invention provides an economically viable, automatic charged particle beam inspection system and method for the inspection of wafers, X-ray masks and similar substrates in a production environment. While it is expected that the predominant use of the invention will be for the inspection of wafers, optical masks, X-ray masks, electron-beam-proximity masks and stencil masks, the techniques disclosed here are applicable to the high speed electron beam imaging of any material.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for creating a ribbon-like electron beam, the apparatus comprising:

an electron source configured to generate an electron beam characterized by an initial cross-sectional shape;

a first lens subsystem for transforming the electron beam into an intermediate-stage beam; and a second lens subsystem for focusing the intermediate-stage beam into the ribbon-like beam that impinges onto a target specimen as an elongated spot characterizing a final cross-sectional shape, wherein the final cross-sectional shape is substantially elongated using the lens subsystems so as to have a length in a first dimension multiple times a length of a second dimension, where the apparatus comprises a non-axisymmetric system, and where the first lens subsystem comprises an Einzel lens that focuses the beam along the second dimension while leaving focus of the beam along the first dimension substantially unchanged and a quadrupole lens that focuses the beam along the first dimension and de-focuses the beam along the second dimension.

2. The apparatus of claim 1, where the electron source comprises a point-like source.

3. The apparatus of claim 1, where the electron source comprises a linear source or a linear array of point-like sources.

4. The apparatus of claim 1, where the first lens subsystem comprises:

a first quadrupole lens that focuses the beam along the second dimension and de-focuses the beam along the first dimension; and a second quadrupole lens that focuses the beam along the first dimension and de-focuses the beam along the second dimension.

5. The apparatus of claim 1, where the intermediate-stage beam is wider along the first dimension than along the second dimension.

6. The apparatus of claim 5, where the intermediate-stage beam comprises a quasi-parallel beam.

7. The apparatus of claim 1, where the second lens subsystem for focusing the intermediate-stage beam into a ribbon-like beam comprises:

a first quadrupole lens that focuses the beam along the first dimension and de-focuses the beam along the second dimension; and a second quadrupole lens that focuses the beam along the second dimension and defocuses the beam along the first dimension.

8. The apparatus of claim 1, where the second lens subsystem comprises a quadrupole lens that focuses the beam along the second dimension and de-focuses the beam along the first dimension.

9. The apparatus of claim 1, where the first dimension of the elongated spot is al least one hundred times greater than the second dimension of the elongated spot.

10. The apparatus of claim 1, where the first dimension of the elongated spot is at least one thousand times greater than the second dimension of the elongated spot.

11. The apparatus of claim 1, where the apparatus further comprises a separation subsystem to separate the quasi-parallel beam from a scattered signal, and where the scattered signal is derived from the elongated spot and so has an elongated dimension.

12. The apparatus of claim 11, where the scattered signal includes secondary electrons.

13. The apparatus of claim 11, where the separation subsystem includes at least one bending magnet that induces a bend to separate the scattered signal from the intermediate-stage beam.

14. The apparatus of claim 13, where the at least one bending magnet includes two bending magnets of opposite polarity to reduce angular deflection of the scattered signal.

15. The apparatus of claim 11, where the separation subsystem includes a Wein velocity filter to separate the scattered signal from the intermediate-stage beam.

16. The apparatus of claim 11, where the separation subsystem includes a mechanism for deflecting the scattered signal in the second dimension.

17. The apparatus of claim 16, where the mechanism for deflecting the scattered signal comprises a Lambertson-style magnet which leaves the intermediate-stage beam unaffected.

18. The apparatus of claim 11, where the apparatus further comprises:

an array detector for receiving the scattered signal into a multitude of detecting elements, where the multitude of detecting elements are spaced along the elongated dimension of the scattered signal.

* * * * *